US012437960B2

(12) United States Patent
Zhu et al.

(10) Patent No.: US 12,437,960 B2
(45) Date of Patent: Oct. 7, 2025

(54) ROTATABLE TEM GRID HOLDER FOR IMPROVED FIB THINNING PROCESS

(71) Applicant: Sandisk Technologies, Inc., Milpitas, CA (US)

(72) Inventors: Xiaochen Zhu, Milpitas, CA (US); Norman Lay, Santa Clara, CA (US); Lito De La Rama, San Jose, CA (US); Jimmy Yeh, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 346 days.

(21) Appl. No.: 18/222,280

(22) Filed: Jul. 14, 2023

(65) Prior Publication Data

US 2024/0128046 A1 Apr. 18, 2024

Related U.S. Application Data

(60) Provisional application No. 63/416,849, filed on Oct. 17, 2022.

(51) Int. Cl.
*H01J 37/20* (2006.01)

(52) U.S. Cl.
CPC .................................... *H01J 37/20* (2013.01)

(58) Field of Classification Search
USPC ..................................................... 250/442.11
See application file for complete search history.

(56) References Cited

U.S. PATENT DOCUMENTS

| | | | | |
|---|---|---|---|---|
| 2012/0085923 A1* | 4/2012 | Coyle | H01J 37/31 | 250/453.11 |
| 2012/0085937 A1* | 4/2012 | Coyle | H01J 37/31 | 250/492.3 |
| 2012/0085939 A1* | 4/2012 | Coyle | G01N 1/32 | 250/492.3 |
| 2021/0296084 A1* | 9/2021 | Kiyohara | H01J 37/3045 | |

* cited by examiner

*Primary Examiner* — Kiet T Nguyen
(74) *Attorney, Agent, or Firm* — Pearl Cohen Zedek Latzer Baratz LLP

(57) ABSTRACT

A rotatable transmission electron microscope (TEM) grid holder includes first and second legs orthogonally positioned with respect to each other. Each clamp holder leg is configured to be received within a hole in a main stage supporting the rotatable TEM grid holder. When the first leg of the clamp holder is affixed within the main stage, the sample has a first orientation with respect to the FIB, and when second leg of the clamp holder is affixed within the main stage, the sample has a second orientation with respect to the FIB, rotated 90° relative to the first orientation. The sample may be rotated back and forth between the first and second orientations multiple times as needed to produce a sample which may be clearly imaged by the TEM system, substantially free of curtaining effects.

20 Claims, 15 Drawing Sheets

Fig. 8
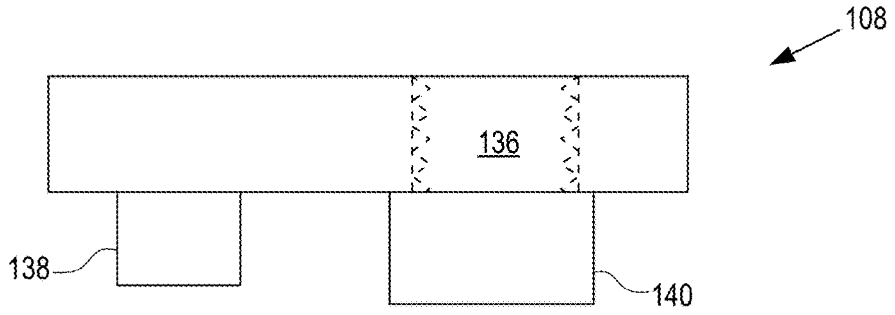
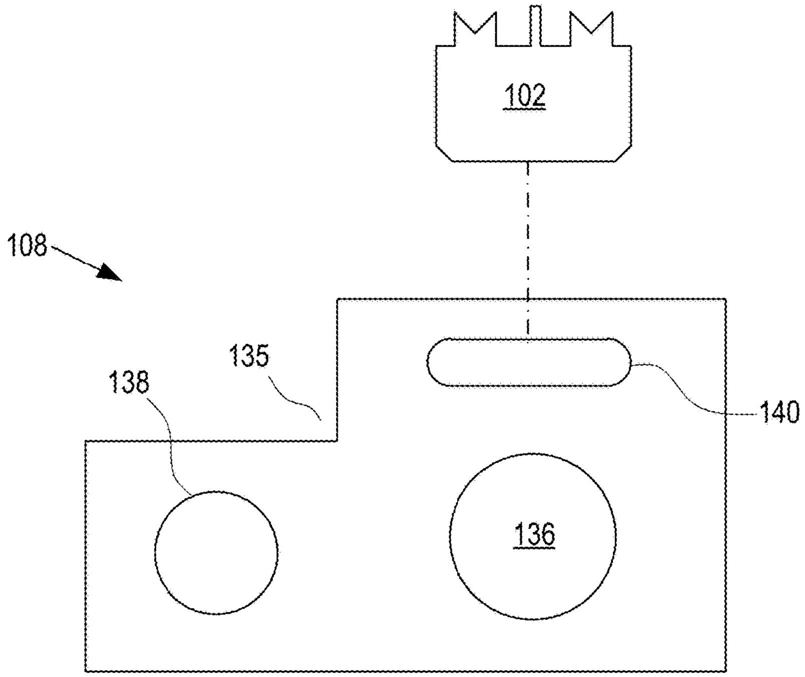
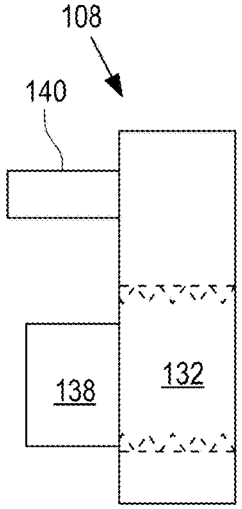
Fig. 9
Fig. 10

ROTATABLE TEM GRID HOLDER FOR IMPROVED FIB THINNING PROCESS

CLAIM OF PRIORITY

The present application claims priority from U.S. Provisional Patent Application No. 63/416,849, entitled "ROTATABLE TEM GRID HOLDER FOR IMPROVED FIB THINNING PROCESS," filed Oct. 17, 2022, which is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid-state drives.

Semiconductor memory may be provided within a semiconductor package, which protects the semiconductor memory and enables communication between the memory and a host device. Examples of semiconductor packages include system-in-a-package (SiP) or multichip modules (MCM), where a plurality of dies are mounted and interconnected on a small footprint substrate. Given the demand for greater storage capacities in the same or smaller form factor semiconductor dies, die features are being fabricated to ever smaller dimensions. These features include for example logic gates, conductive lines and spacing therebetween, spacing and diameters of contact holes and surface geometries such as the corners and edges of various integrated circuit features.

Process control during semiconductor die fabrication refers to the monitoring of processes such as the formation die features. As die features get smaller and smaller, it becomes ever more important to implement strict process control over the sizes of die features. One popular method for process control involved measuring die features using a scanning electron microscope (SEM). A SEM is an electron microscope used to produce images by rastering a focused electron beam across the surface of a sample. However, die features have reached the size where they are too small to be measured by conventional SEM.

Transmission electron microscopes (TEMs) allow observers to see extremely small features, on the order of nanometers. In contrast to SEMs, which only image the surface of a material, TEM allows analysis of the internal structure of a sample. Using a TEM, semiconductor device features are imaged from the interaction of the electrons with the sample as the beam is transmitted through the specimen. The image is then magnified and focused onto an imaging device.

In order to prepare a sample of a semiconductor die for imaging by a TEM, the sample is milled to very thin dimensions, often using a focused ion beam (FIB). FIB systems use a finely focused beam of ions (usually gallium) that can be operated at high beam currents for site specific sputtering or milling of samples. Dual beam systems are known, using a FIB to mill the sample and a TEM to image it.

One problem with milling by FIB systems is curtaining. Semiconductor die samples typically have a heterogeneous structure, including for example both metal along with silicon and silicon dioxide. The ion beam in a FIB system will mill some of these features more quickly than others. The result is a rippled sample surface that causes shadowing or curtaining that impairs the quality of the image obtained by the TEM.

DESCRIPTION OF THE DRAWINGS

FIGS. 8-11 are top, front, edge and perspective views of a back portion of a TEM grid clamp according to embodiments of the present technology.

DETAILED DESCRIPTION

Figure 1:
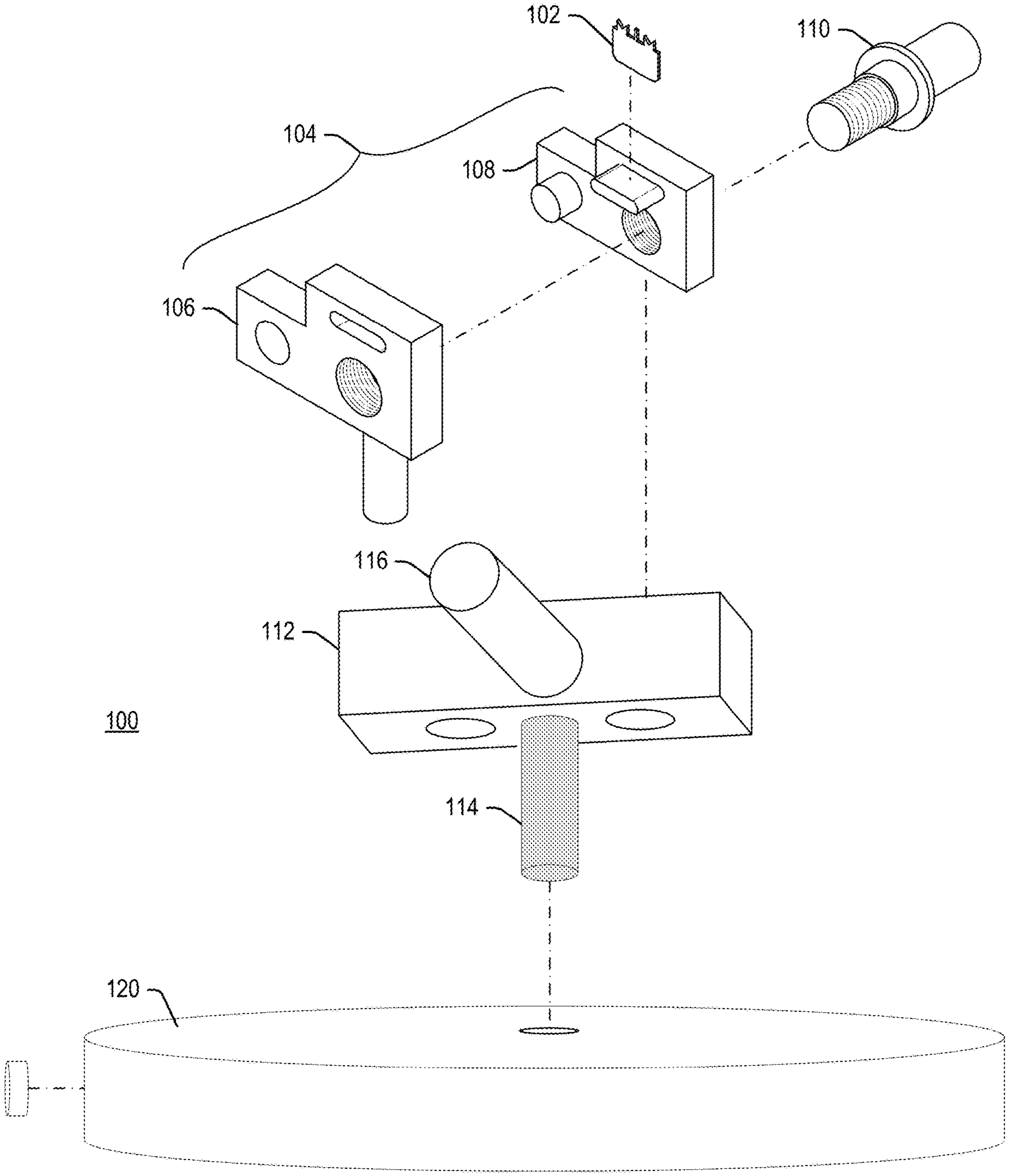
FIG. 1 is an exploded perspective view of a rotatable TEM grid holder according to embodiments of the present technology.

The present technology will now be described with reference to the figures, which in embodiments, relate to a rotatable TEM grid holder. In embodiments, a TEM grid having a sample may be affixed to a clamp, which in turn is received in a rotatable clamp holder. The clamp holder has first and second legs orthogonally positioned on the clamp holder with respect to each other. Each clamp holder leg is configured to be received within a hole in a main stage supporting the rotatable TEM grid holder.

When the first leg of the clamp holder is affixed within the main stage, the sample has a first orientation with respect to the FIB, and when second leg of the clamp holder is affixed within the main stage, the sample has a second orientation with respect to the FIB, rotated 90° relative to the first orientation. When for example milling of the sample at the first orientation by the FIB creates curtaining effects, the sample may be rotated 90° to the second orientation to effectively remove the curtaining effects upon continued milling. The sample may be rotated back and forth between the first and second orientations multiple times as needed to produce a sample which may be clearly imaged by the TEM system, substantially free of curtaining effects.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is 0.15 mm, or alternatively ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

An embodiment of the present technology will now be explained with reference to the exploded perspective view of FIG. 1 and the various views of FIGS. 2-22. FIG. 1 is an exploded view showing the rotatable TEM grid holder 100 including a TEM grid 102 configured to be held within a clamp 104. Clamp 104 includes front and back portions 106, 108 which fit together and are clamped with a set screw 110. The clamp 104 is in turn configured to be held within a rotatable clamp holder 112 including legs 114 and 116 mounted on adjacent sides of the clamp holder 112. Clamp holder 112 is in turn configured to mount within main stage 120 by either of legs 114 or 116 fitting within one or more holes within the main stage. The rotatable TEM grid holder 100 is configured to hold the TEM grid 102 in one of at least two different orientations, depending on which leg 114, 116 is mounted to the main stage 120 as explained in greater detail below.

Figure 2:
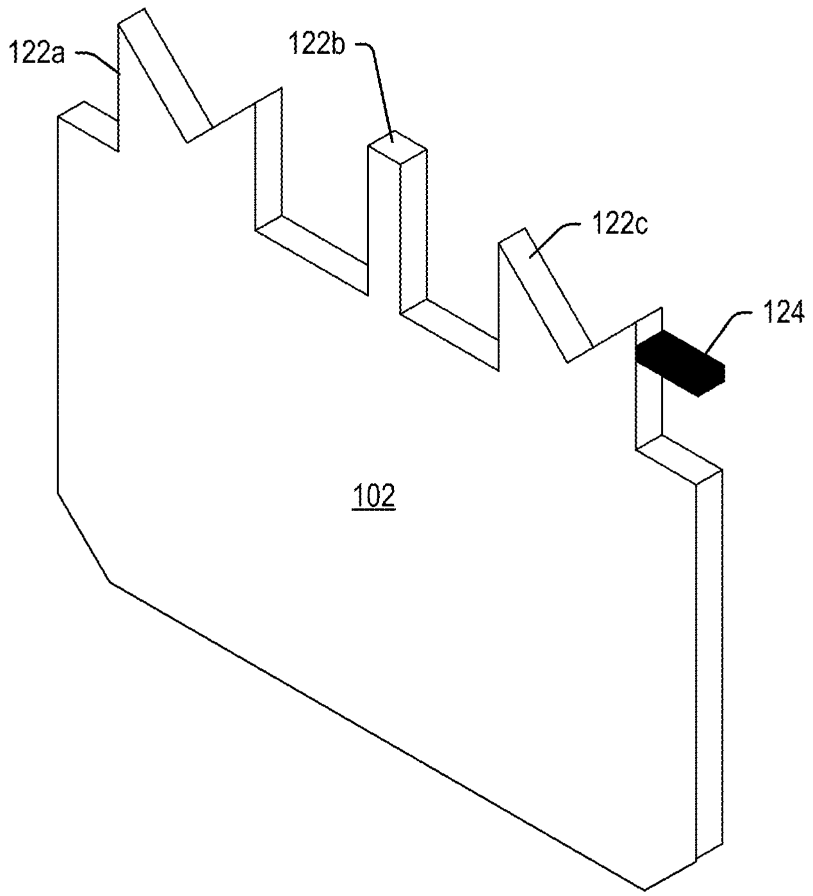
FIGS. 2-3 are views of a TEM grid having a semiconductor sample affixed to a leg for analysis according to embodiments of the present technology.
Figure 3:
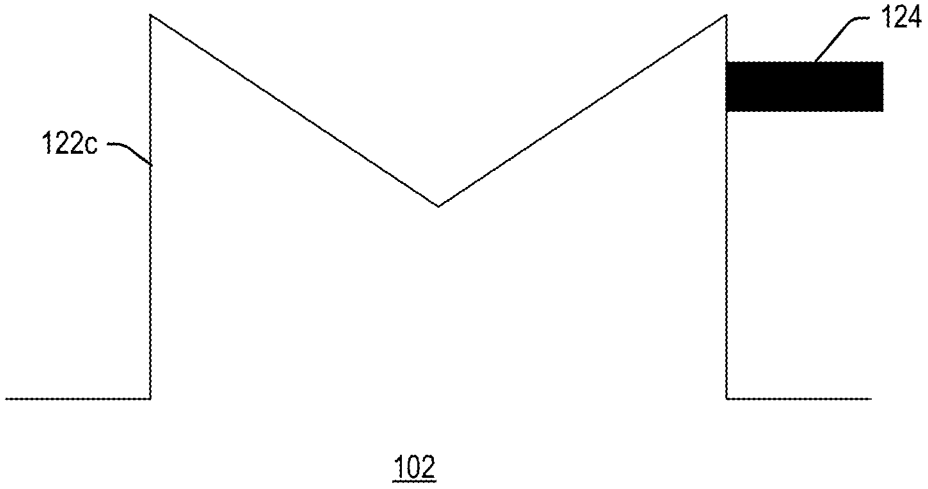
Figure 4:
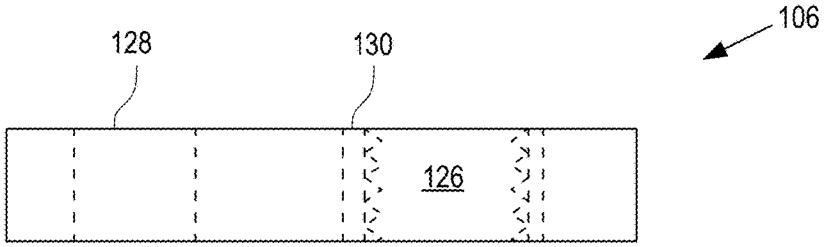
FIGS. 4-7 are top, front, edge and perspective views of a front portion of a TEM grid clamp according to embodiments of the present technology.
Figure 5:
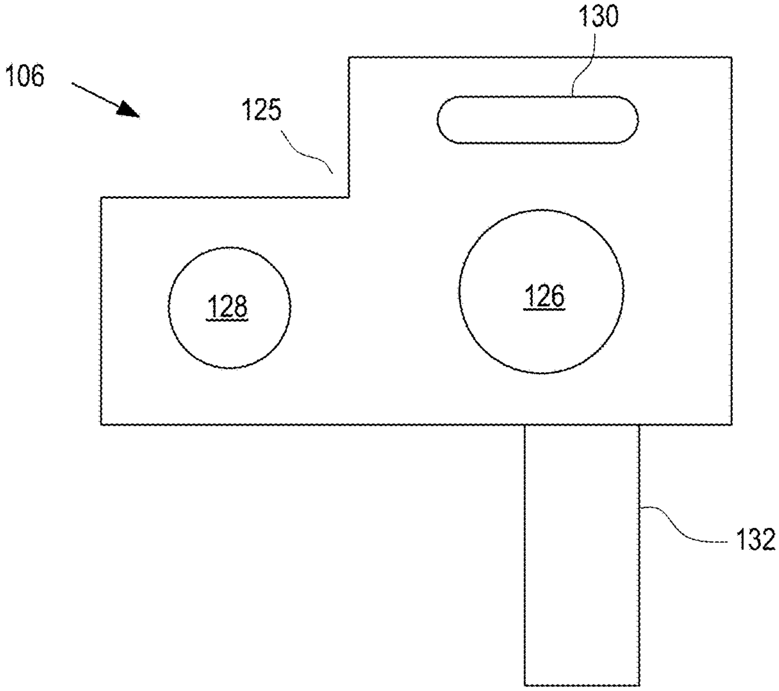
Figure 6:
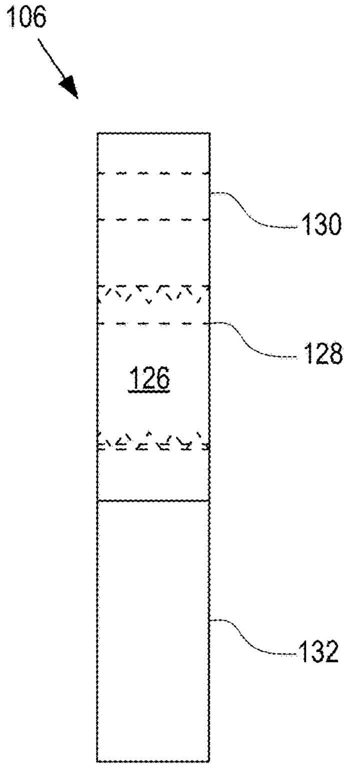
Figure 7:
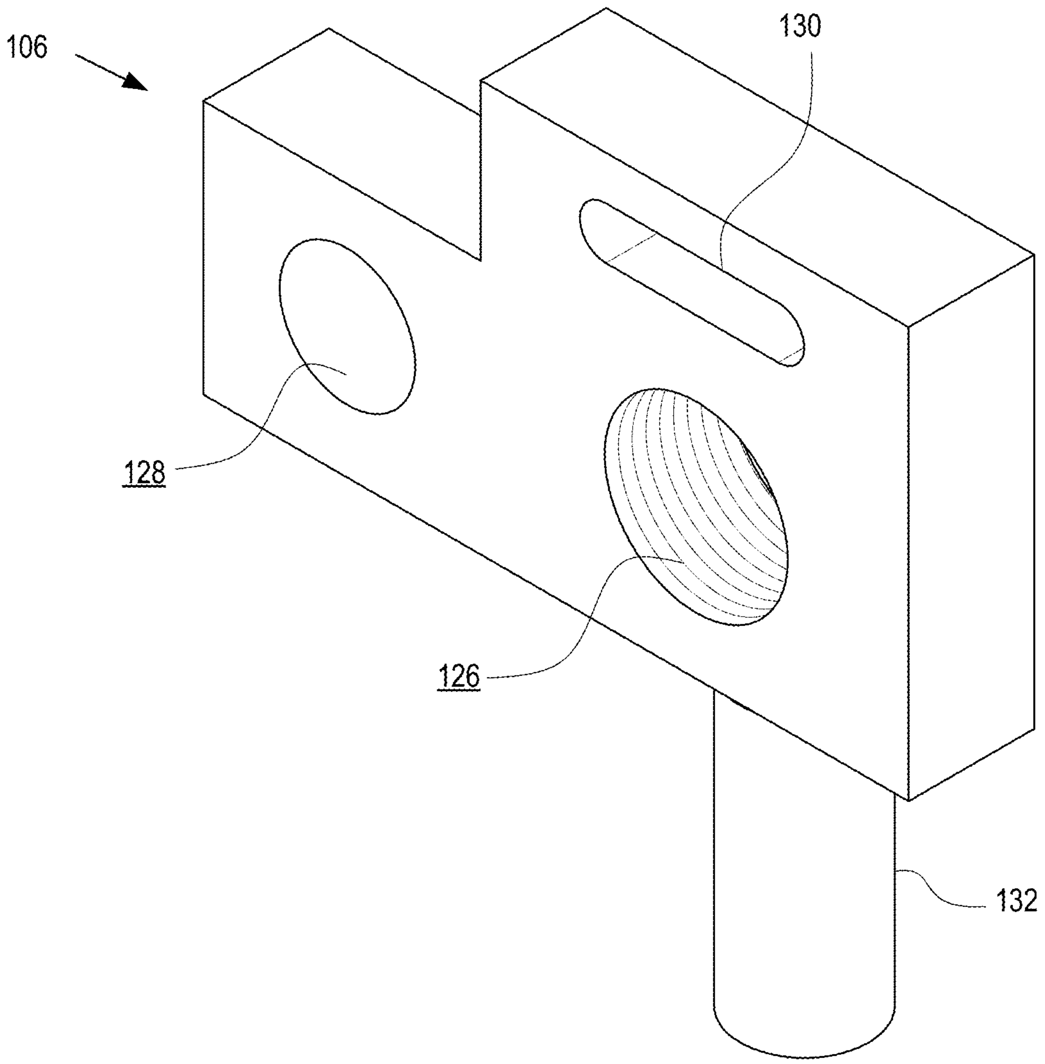

FIGS. 2 and 3 are enlarged views of a sample holder in the form of a TEM grid 102. The TEM grid 102 may be of known construction, such as for example an Omniprobe TEM grid available from Agar Scientific LTD, having offices at Stansted, Essex, UK. However, in general, TEM grid 102 may include fingers **122*a*, 122*b* and 122*c* (collectively fingers 122), onto one of which a sample 124 may be affixed for TEM analysis. The sample 124, shown schematically in the figures, may for example be a lamella taken from a portion of a semiconductor die and including features subject to highly controlled process and dimensional parameters. As is known, the sample 124 may be transferred from a needle (not shown) to one of the fingers 122** and welded thereon, as by platinum. It is understood that the present technology may be used with any of a wide variety of TEM grids or other sample holders including a sample provided for FIB milling and/or TEM analysis.

FIGS. 4-7 are top, front, edge and perspective views of a front portion 106 of a clamp 104 for holding the TEM grid 102. The clamp front portion 106 may have a length of 0.6 cm, and two sections with differing heights of 0.4 and 0.6 cm, respectively, to define a notch 125. These dimensions are by way of example only and may vary in further embodiments. The clamp front portion 16 may have a thickness of 0.5 cm, but may be thinner or thicker than that in further embodiments. The clamp front portion 106 may be formed of various rigid materials, including for example metals such as aluminum, fsetpolymers such as various plastics, or ceramics.

The clamp front portion 106 includes a first screw hole 126 for receiving a set screw as explained below. In one embodiment, the first hole 126 may have a diameter of 0.2 to 0.4 cm. However, the diameter and thread pitch of the first hole 126 may vary in different embodiments of the present technology. The clamp front portion 106 may further include a second hole 128 for receiving a boss as explained below. In one embodiment, the second hole 128 may have a diameter of 0.1 to 0.3 cm, but the diameter of the second hole 128 may vary in different embodiments of the present technology. The second hole 128 may be smaller or larger than the first hole 126 in different embodiments. The embodiment shown further includes a slot 130 for receiving a grid perch as explained below. The slot 130 may have a length of 0.1 to 0.5 cm, though it may be longer or shorter than that in further embodiments.

The clamp front portion 106 further includes a post 132 configured to be received within a clamp holder as explained below. The post may be circular have a diameter of 0.5 cms. However, the cross-circular shape and the diameter of post 132 may vary in further embodiments.

Figure 11:
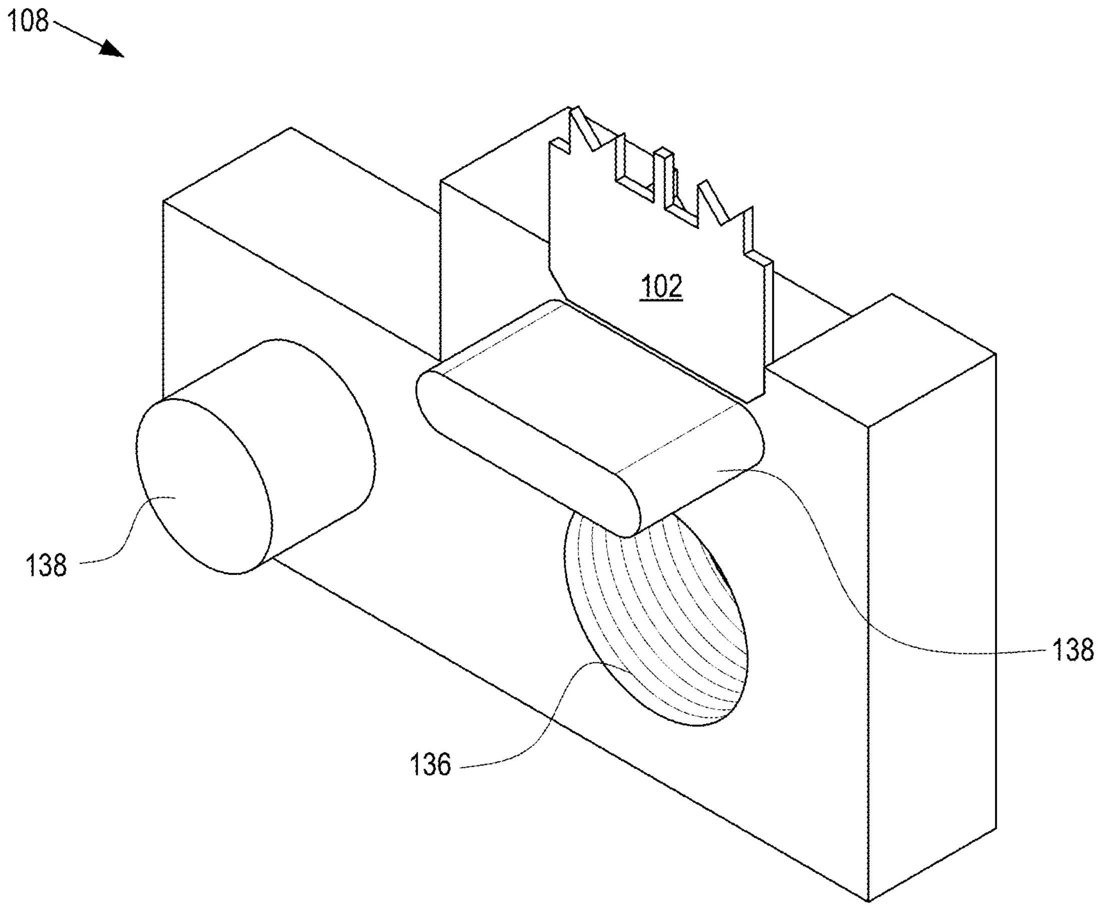

FIGS. 8-11 are top, front, edge and perspective views of a back portion 108 of the clamp 104 for holding the TEM grid 102. The clamp back portion 108 may have the same dimensions and may be of the same material as the front portion 106 (without post 132). The clamp back portion 108 includes a screw hole 136 matching the diameter and thread pitch of screw hole 126 for receiving a set screw as explained below. The clamp back portion 108 may further include a boss 138 configured to fit snugly within the second hole 128 of the clamp front portion 106. The embodiment shown further includes a grid perch 140 configured to fit snugly within slot 130 of the clamp front portion 106. The grid perch 140 is configured to support the TEM grid 102 as indicated in FIG. 9 and as shown in FIG. 11 when received in slot 130. As will be described below, the TEM grid 102 may be held within clamp 104 by a variety of methods, and the grid perch 140 and slot 130 may be omitted in further embodiments.

Figure 12:
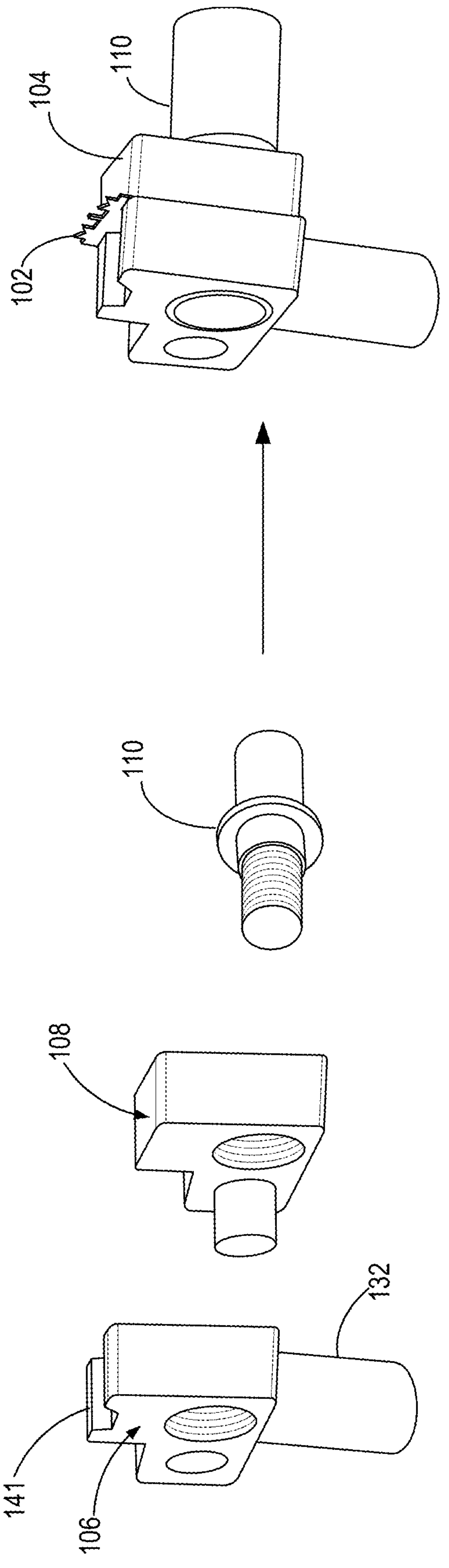
FIG. 12 is a perspective view illustrating how the front and back portions of the TEM grid clamp attached to each other with a set screw according to embodiments of the present technology.

Referring now to the perspective view of FIG. 12, the front and rear portions 106, 108 of clamp 104 may be clamped together with set screw 110. The boss 138 fits within hole 128 and the set screw 110 threads through holes 126, 136 to ensure proper alignment of the front and back portions of clamp 106. In embodiments of FIGS. 4-11 the TEM grid 102 may seat on perch 140 and be secured within clamp 104 when the front and back portions are tightened together by set screw 110. In further embodiments, the perch 140 and slot 130 may be omitted, and the TEM grid 102 may be secured within the clamp 106 by an upper section of back portion 108 and a pair of tabs 141 on the front portion 106 as shown in FIG. 12. The TEM grid 102 may be secured within clamp 104 by other structures and methods in further embodiments.

Figure 13:
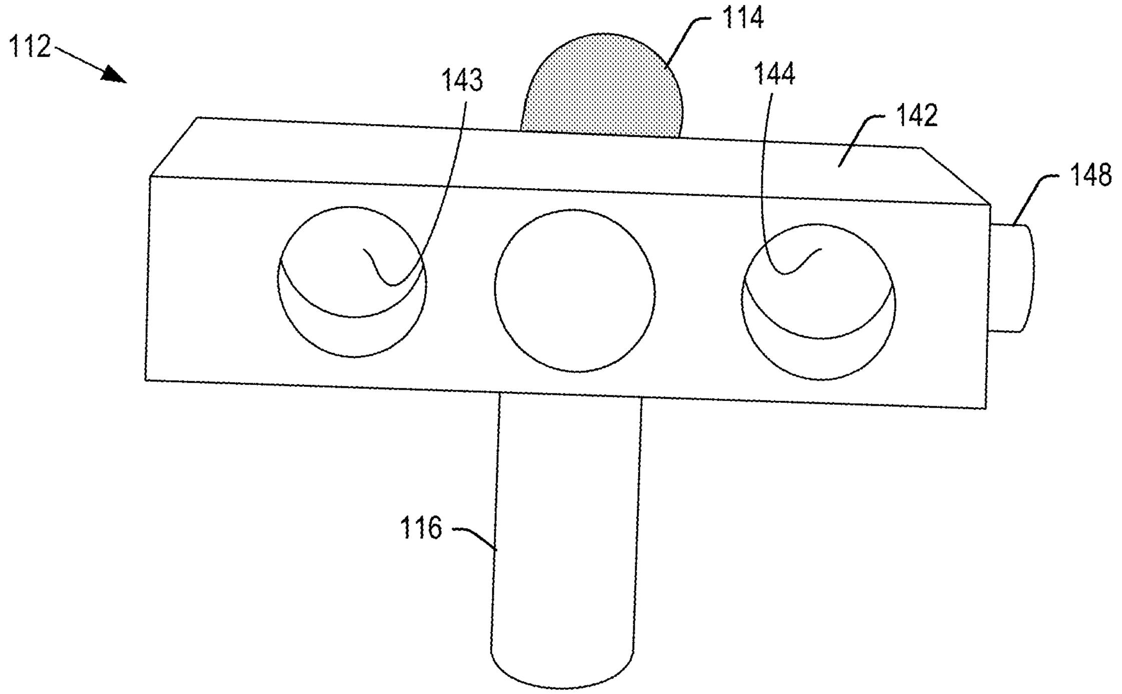
FIGS. 13-14 are different perspective views of a rotatable TEM grid clamp holder according to embodiments of the present technology.
Figure 14:
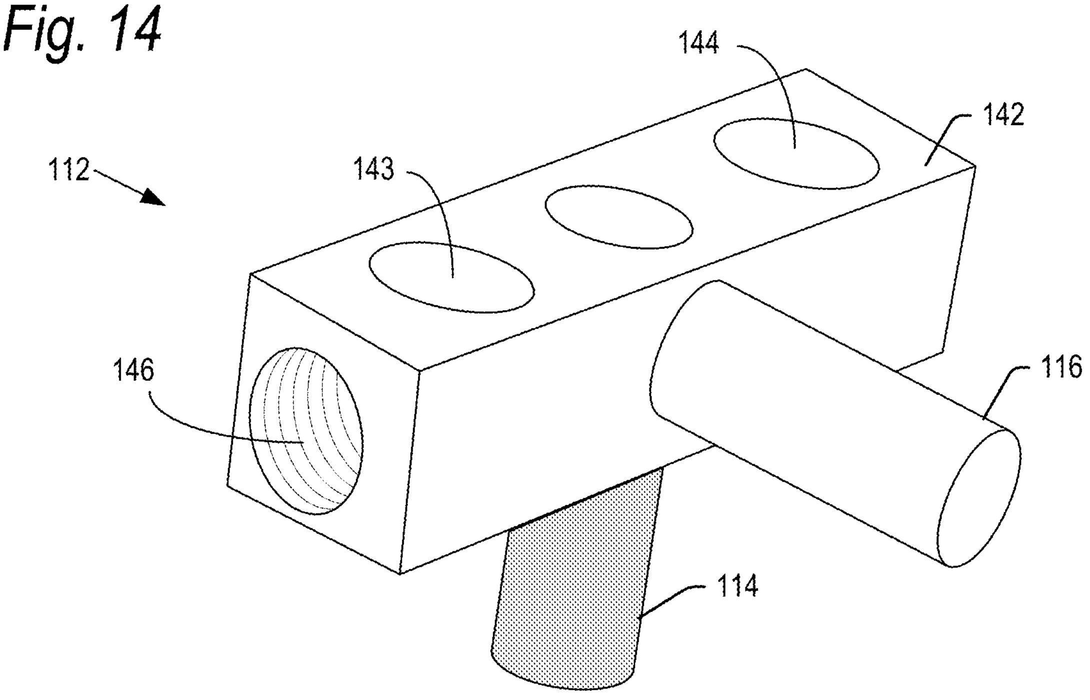

FIGS. 13 and 14 are different perspective views of a rotatable clamp holder 112 configured to hold the clamp 104 and TEM grid 102 on a main stage in different orientations as explained below. The rotatable clamp holder 112 may have a base 142 with generally planar surfaces defining a square or rectangle in cross-section. The base 142 may be 1.5 to 2.5 cm. long and 0.5 wide, though these dimensions may vary in further embodiments. The clamp holder 112 may be formed of various materials including the same materials as clamp 104.

A first leg 114 is affixed to or otherwise formed on a first of the base planar surfaces, and a second leg 116 is affixed to or otherwise formed on a second of the base planar surfaces adjacent to the first planar surface. Leg 114 is shown shaded in the figures to provide easy distinction from leg 116, but the first and second legs 114, 116 may be identical to each other, having the same diameter and length. The legs 114, 116 may be circular have a diameter of 0.5 cms. However, the cross-circular shape and the diameter of legs 114, 116 may vary in further embodiments.

In embodiments, the first and second legs 114, 116 may be radially offset from each other by an angle of 90° about a central axis of rotation of the clamp holder 112. However, it is conceivable that the first and second legs 114, 116 be radially offset from each other by other angles ranging for example from 60° to 120°. In further embodiments, instead of being located on the adjacent planar surfaces, the legs 114 and 116 may be mounted on opposed surfaces of base 142 so as to be radially offset 180° from each other.

The rotatable clamp holder 112 further includes one or more holes 143, 144 configured to receive the post 132 of the clamp 104 to mount the clamp 104 on the clamp holder 112. Having multiple holes 143, 144 increases the flexibility as to how the clamp 104 may be secured onto the rotatable clamp holder 112. However, there may be a single hole, or more than two holes, for receiving post 132 in further embodiments. Screw holes 146 (one of which is shown in FIG. 14) may be provided at opposed ends of base 142 to receive set screws 148 (one of which is shown in FIG. 13). Once tightened, a set screw 148 bears against the post 132 in one of the holes 143, 144 to affix the clamp 104 to the clamp holder 112.

In embodiments, the post 132 and holes 143, 144 are circular, so that the clamp 104 and TEM grid 102 may be rotated 360° about a central axis through the hole 143, 144 into which the post 132 is received. In further embodiments, the post 132 and holes 143, 144 may have matching, non-circular cross-sections to limit the number of positions the clamp 104 may be mounted on the clamp holder 112.

Figure 15:
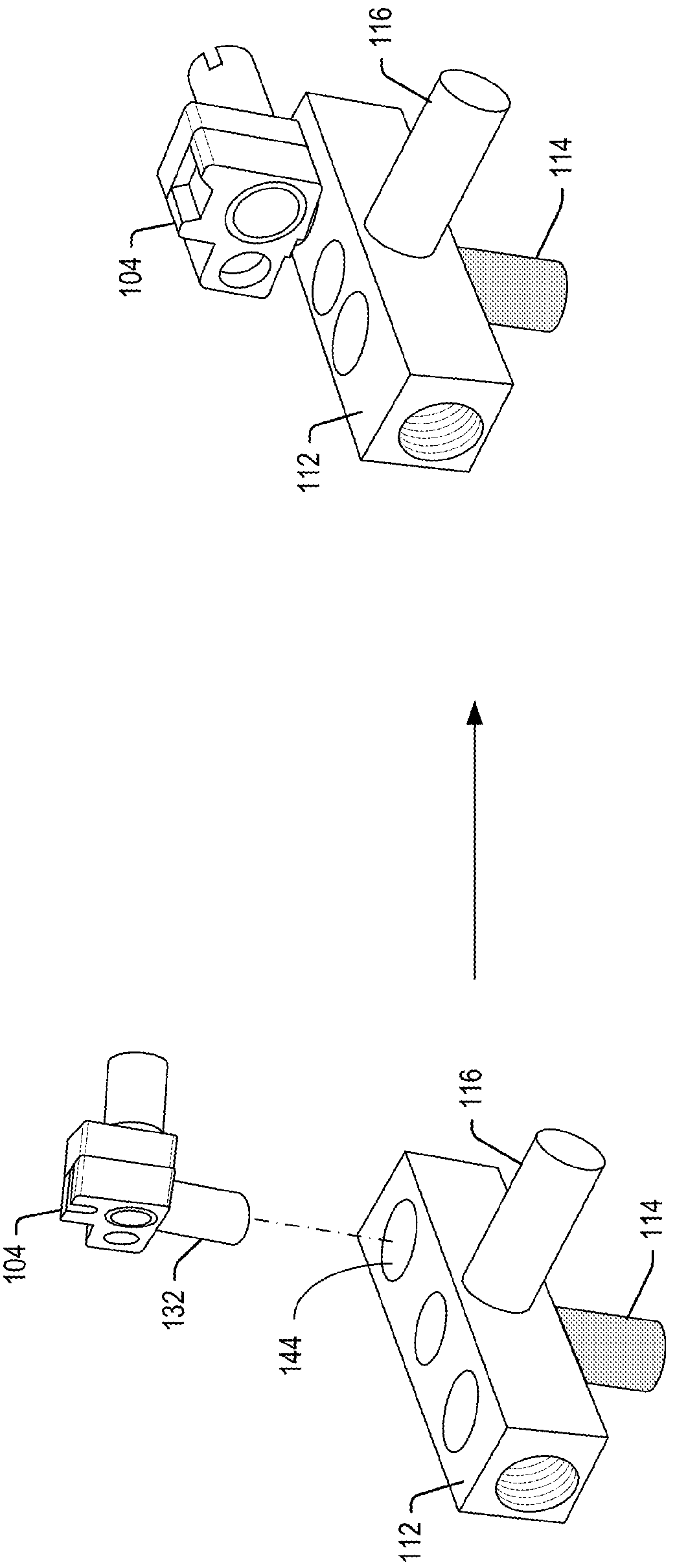
FIG. 15 is a perspective view illustrating how the TEM grid clamp affixes to the rotatable clamp holder according to embodiments of the present technology.

FIG. 15 is a perspective view illustrating the clamp 104 being mounted to the clamp holder 112 by means of post 132 fitting within hole 144. As noted, once the post 132 is mounted in hole 144, the set screw nearest the hole 144 (not shown in FIG. 15) may be tightened to fix the position of the clamp 104 and TEM grid 102 on the clamp holder 112.

Figure 16:
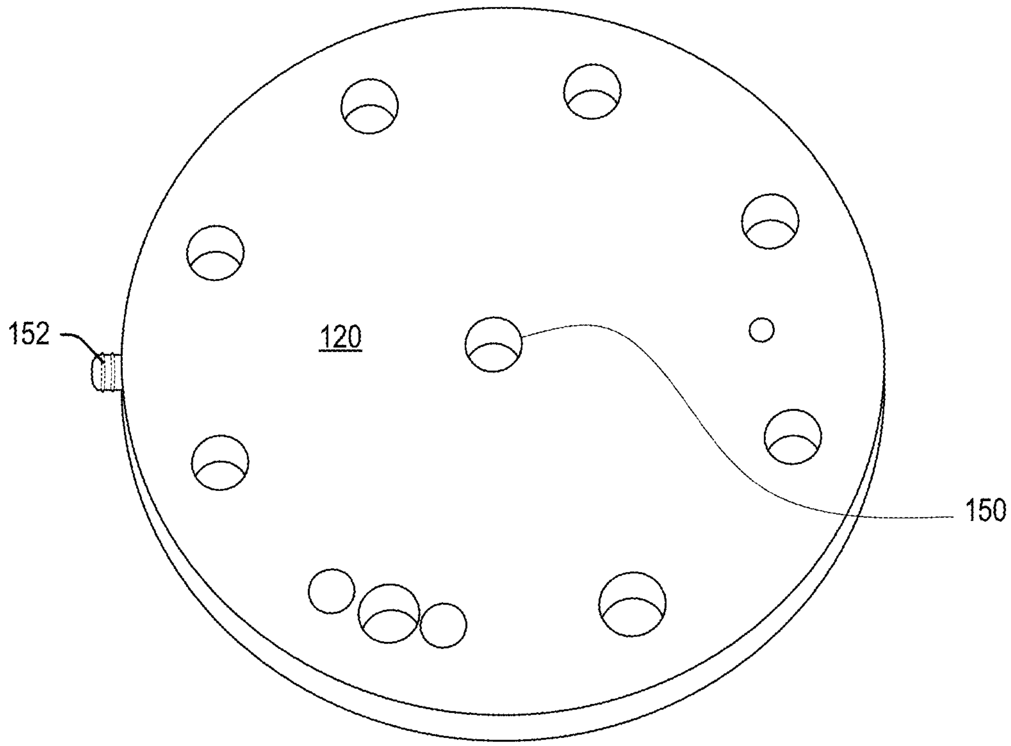
FIG. 16 is a perspective view of a mainstage for holding the rotatable clamp holder according to embodiments of the present technology.

FIG. 16 is a perspective view of a main stage 120 for supporting the rotatable clamp holder 112, clamp 104 and TEM grid 102 in one of multiple positions. The main stage 120 may be supported for translation in three orthogonal dimensions to thus position the TEM grid 102 mounted thereon in a desired location relative to a TEM/FIB system (not shown) to image and mill the sample 124. The main stage 120 is shown as circular, but the main stage 120 may have other shapes in further embodiments including for example square or rectangular. The main stage 120 includes a number of holes, at least some of which are configured to receive the legs 114, 116 of the rotatable clamp holder 112, including a central hole 150. The main stage 120 may further include a set screw 152 for securing the rotatable clamp holder 112 to the main stage 120 as explained below.

Figure 17:
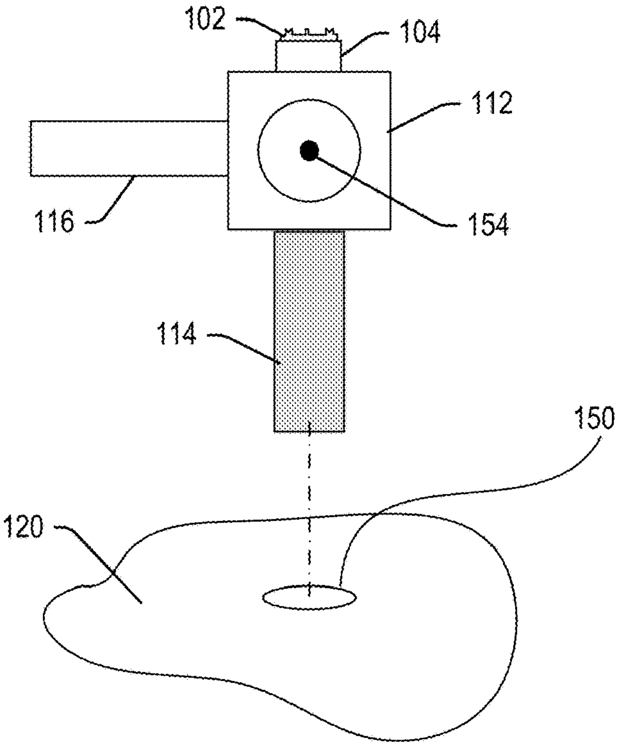
FIG. 17 is a front perspective view showing a first leg of the rotatable clamp holder positioned for mounting to the main stage according to embodiments of the present technology.
Figure 18:
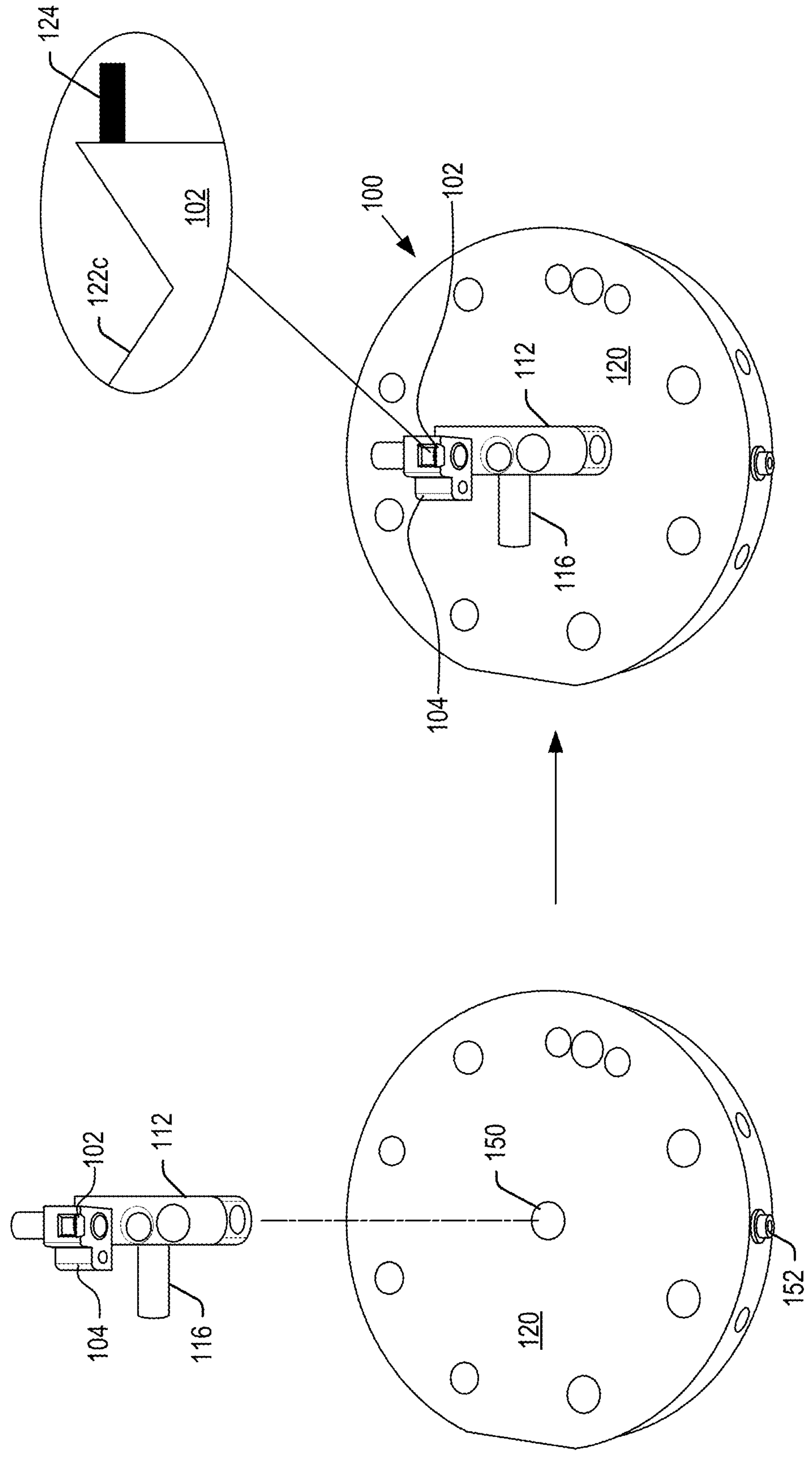
FIG. 18 is a perspective view illustrating how the TEM grid positioned when a first leg clamp holder mounts within the main stage according to embodiments of the present technology.

FIG. 17 is a view along an axis of rotation 154 of the rotatable clamp holder 112 showing the clamp holder positioned with leg 114 to be inserted within a central hole 150 of the center stage 120. FIG. 18 is a perspective view showing the rotatable clamp holder 112 in the same position as FIG. 17 (left hand side of FIG. 18). The leg 114 may be positioned within a hole such as central hole 150 on main stage 120, and the set screw 152 tightened to bear against the leg 114 within the main stage, to lock the clamp holder 112, clamp 104 and TEM grid 102 in a fixed position on the main stage 120. In this position, the clamp 104 and the TEM grid 102 are in a vertical upright position. As shown in the enlarged sectional view to the right in FIG. 18, in this position, the sample 124 extends horizontally from finger **122*c* for milling by the FIB and imaging by the TEM. Once positioned as shown in FIG. 18, the main stage 120 may be translated in X, Y and/or Z directions to position the sample 124** for milling by the FIB and/or imaging by the TEM.

Figure 19:
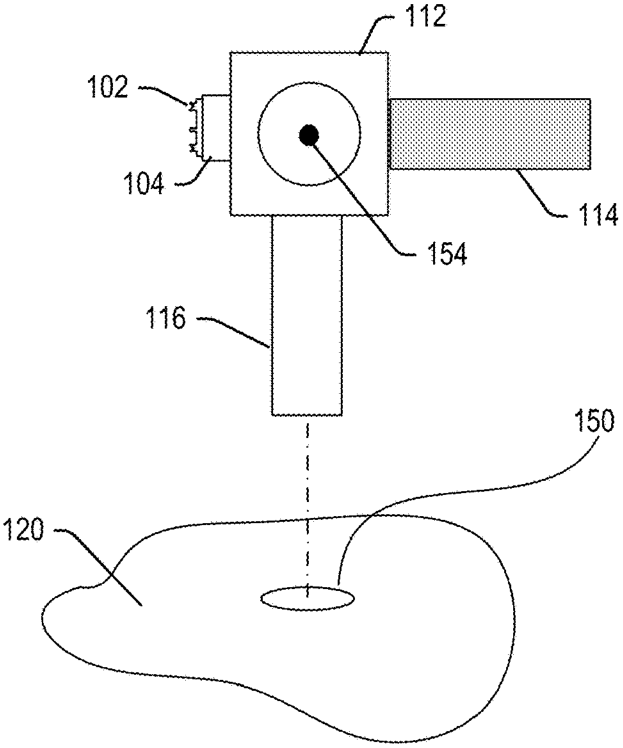
FIG. 19 is a front perspective view showing a second leg of the rotatable clamp holder positioned for mounting to the main stage according to embodiments of the present technology.
Figure 20:
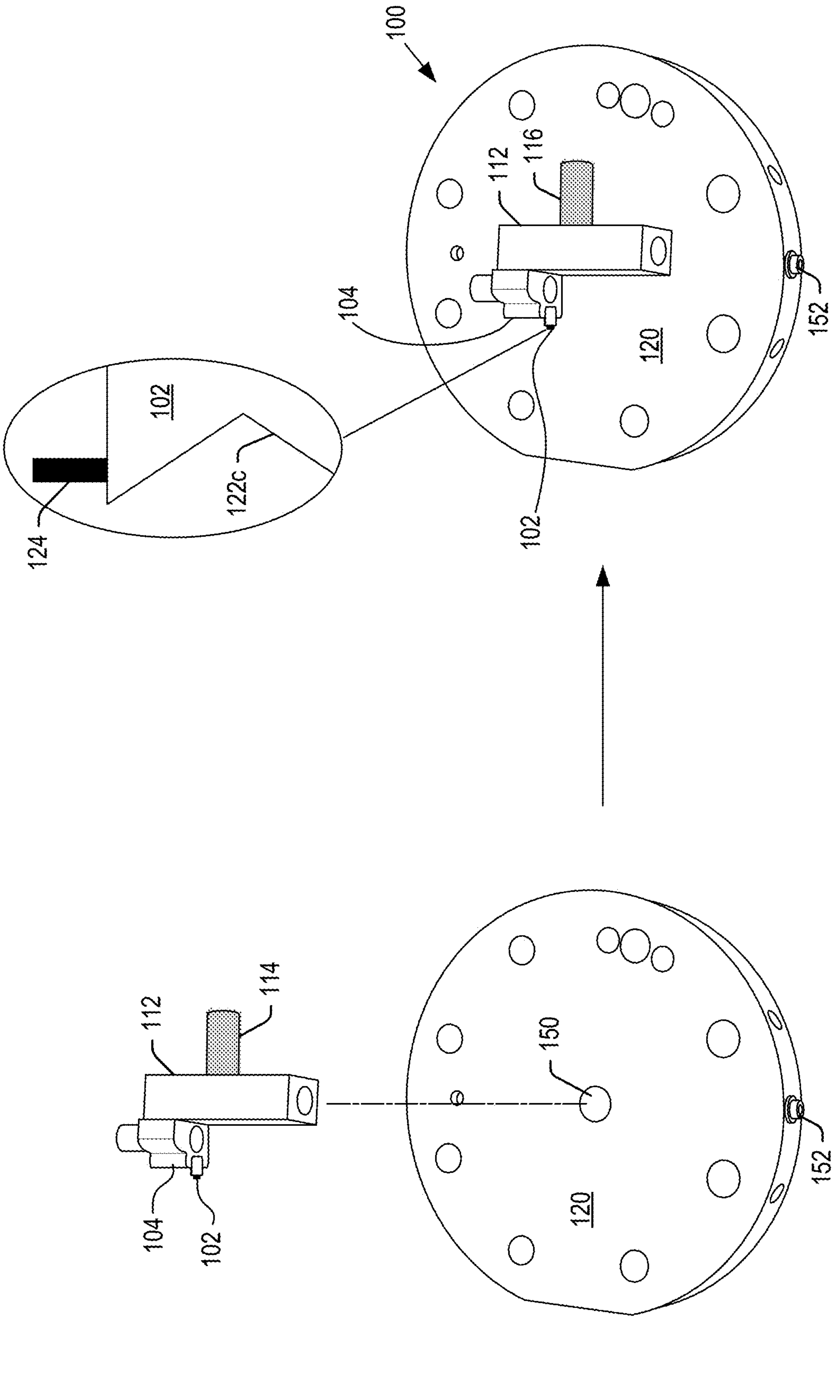
FIG. 20 is a perspective view illustrating how the TEM grid positioned when a first leg clamp holder mounts within the main stage according to embodiments of the present technology.

FIG. 19 is a view along the axis of rotation 154 of the rotatable clamp holder 112 showing the clamp holder rotated 90° counterclockwise relative to the position shown in FIG. 17. In this position, the leg 114 is oriented to be inserted into the central hole 150 of the center stage 120. FIG. 20 is a perspective view showing the rotatable clamp holder 112 in the same position as FIG. 19 (left hand side of FIG. 20). The leg 116 may be positioned within a hole such as central hole 150 on main stage 120, and the set screw 152 tightened to bear against the leg 116 within the main stage, to lock the clamp holder 112, clamp 104 and TEM grid 102 in a fixed position on the main stage 120. In this position, the clamp 104 and the TEM grid 102 are in a horizontal position, facing to the side. As shown in the enlarged sectional view to the right in FIG. 20, in this position, the sample 124 extends vertically from finger **122*c* for milling by the FIB and imaging by the TEM. Once positioned as shown in FIG. 20, the main stage 120 may be translated in X, Y and/or Z directions to position the sample 124** for milling by the FIB and/or imaging by the TEM.

In embodiments, the legs 114, 116 and hole 150 are circular, so that the clamp holder 112, clamp 104 and TEM grid 102 may be rotated 360° about a central axis through the central hole 150 into which one of the legs 114, 116 is received. In further embodiments, the legs 114, 116 and hole 150 may have matching, non-circular cross-sections to limit the number of positions the clamp holder 112, clamp 104 and TEM grid 102 may be mounted on the main stage 120.

Figure 21:
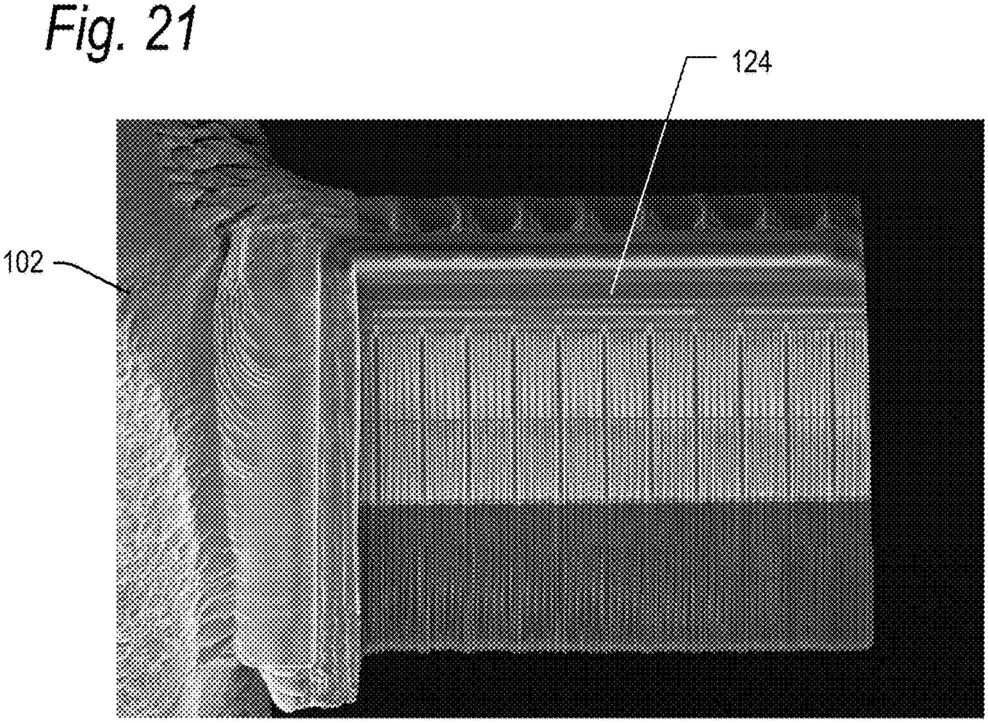
FIG. 21 is a TEM image of the sample positioned in a first orientation.
Figure 22:
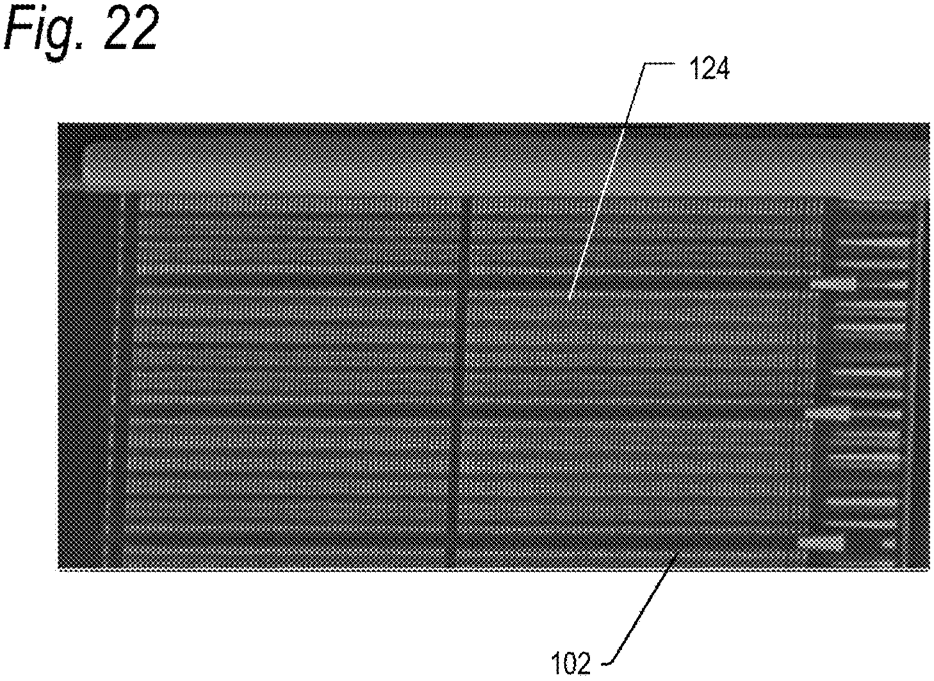
FIG. 22 is a TEM image of the sample positioned in a second orientation.

FIGS. 21 and 22 are images captured by a TEM system. In FIG. 21, leg 114 is positioned within the main stage 120 and the sample 124 extends horizontally from finger 122*c*. Milling of the sample 124 in this position by the FIB has created a curtaining effect (the darker shadowed image toward the bottom of the sample 124). In accordance with aspects of the present technology, the rotatable clamp holder 112 may thereafter be removed from the main stage 120, rotated 90°, and the leg 116 positioned within the main stage 120. In this position, the sample extends vertically from finger 122*c* as shown in FIG. 22. At this point, further milling of the sample by the FIB effectively removes the curtaining effect and allows for a clear TEM image as shown in FIG. 22.

The rotatable clamp holder 112 may be manually positioned with either of legs 114, 116 positioned within main stage 120 to perform the milling and imaging shown in FIGS. 21 and 22. The legs 114, 116 comprise means for rotating the clamp holder 112 between two positions to enable the multiple milling/imaging positions. It is further contemplated that the rotatable clamp holder 112 may be inserted, removed, and rotated multiple times so that the sample 124 may be moved back and forth between its horizontal and vertical positions multiple times to remove residual curtaining effects and enhance the milling and imaging of the sample 124.

Figure 23:
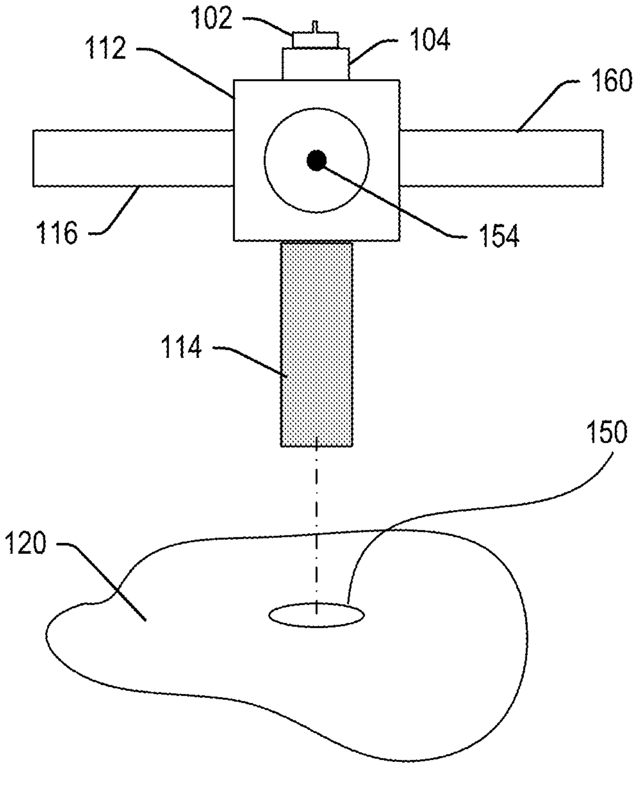
FIG. 23 is a perspective view of a rotatable TEMS grid holder according to alternative embodiments of the present technology.

In a further embodiment shown in FIG. 23, three legs 114, 116 and 160 may be positioned on the rotatable clamp holder 112. The leg 160 may be opposed (offset by 180°) from leg 116. This embodiment may operate with a special TEM grid having a single finger to allow access to the sample mounted on the finger in any of three positions—facing horizontally to the left, facing vertical and facing horizontally to the right.

In summary, the present technology relates to a rotatable transmission electron microscope (TEM) sample holder, the sample holder holding a sample for imaging and/or milling, the rotatable TEM sample holder comprising: a clamp configured to releasably secure the TEM sample holder; a clamp holder configured to releasably secure the clamp, the clamp holder having a central axis of rotation, and comprising first and second legs extending radially from the axis of rotation, the first and second legs being radially offset from each other on the clamp holder; and a main stage configured to support the clamp holder and clamp, and configured to position the sample for the imaging and/or the milling; wherein the clamp holder may be placed in a first position on the main stage with the first leg positioned in the main stage for imaging and/or milling the sample while the sample is in a first orientation; wherein the clamp holder may be placed in a second position on the main stage with the second leg positioned in the main stage for imaging and/or milling the sample while the sample is in a second orientation different than the first orientation; and wherein the clamp holder may be manually moved between the first and second positions.

In another example, the present technology relates to a rotatable transmission electron microscope (TEM) sample holder, the sample holder holding a sample for imaging and/or milling, the rotatable TEM sample holder comprising: a clamp configured to releasably secure the TEM sample holder; a clamp holder configured to releasably secure the clamp, the clamp holder having a central axis of rotation, and comprising a plurality of legs extending radially from the axis of rotation, the plurality of legs being radially offset from each other on the clamp holder; and a main stage configured to support the clamp holder and clamp, and configured to position the sample for the imaging and/or the milling; wherein the clamp holder is configured to be rotated between a plurality of positions on the main stage by manually inserting different ones of the plurality of legs in the main stage for imaging and/or milling the sample while the sample is in one of a plurality of positions.

In a further example, the present technology relates to a rotatable transmission electron microscope (TEM) sample holder, the sample holder holding a sample for imaging and/or milling, the rotatable TEM sample holder comprising: a clamp configured to releasably secure the TEM sample holder; a clamp holder configured to releasably secure the clamp, the clamp holder having a central axis of rotation, and comprising a plurality of legs extending radially from the axis of rotation, the plurality of legs being radially offset from each other on the clamp holder; a main stage configured to support the clamp holder and clamp, and configured to position the sample for the imaging and/or the milling; and means for rotating the clamp holder between a plurality of positions on the main stage for imaging and/or milling the sample while the sample is in one of a plurality of positions.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A rotatable transmission electron microscope (TEM) sample holder, the sample holder holding a sample for imaging and/or milling, the rotatable TEM sample holder comprising:

a clamp configured to releasably secure the TEM sample holder;

a clamp holder configured to releasably secure the clamp, the clamp holder having a central axis of rotation, and comprising first and second legs extending radially from the axis of rotation, the first and second legs being radially offset from each other on the clamp holder; and a main stage configured to support the clamp holder and clamp, and configured to position the sample for the imaging and/or the milling;

wherein the clamp holder may be placed in a first position on the main stage with the first leg positioned in the main stage for imaging and/or milling the sample while the sample is in a first orientation;

wherein the clamp holder may be placed in a second position on the main stage with the second leg positioned in the main stage for imaging and/or milling the sample while the sample is in a second orientation different than the first orientation; and wherein the clamp holder may be manually moved between the first and second positions.

2. The TEM sample holder of claim 1, wherein the first and second legs are radially offset 90° from each other.

3. The TEM sample holder of claim 1, wherein the first and second orientations are radially offset 90° from each other.

4. The TEM sample holder of claim 1, wherein the clamp comprises a post and the clamp holder comprises a first set of one or more holes configured to receive the post to releasably secure the clamp to the clamp holder.

5. The TEM sample holder of claim 4, further comprising a first set of one or more set screws for securing the post within the first set of one or more holes after the post is positioned in the first set of one or more holes.

6. The TEM sample holder of claim 5, wherein the post is circular and configured to rotate 360° relative to the first set of one or more holes before being secured by the first set of one or more set screws within the one or more holes.

7. The TEM sample holder of claim 4, wherein the first set of one or more holes comprise two holes.

8. The TEM sample holder of claim 1, wherein the main stage comprises a second set of one or more holes configured to receive the first and second legs.

9. The TEM sample holder of claim 8, further comprising a second set of one or more set screws for securing the first or second legs in the second set of one or more holes after one of the first and second legs is positioned within the second set of one or more holes.

10. The TEM sample holder of claim 9, wherein the first and second legs are circular and configured to rotate 360° relative to the second set of one or more holes before being secured by the second set of one or more set screws within the second set of one or more holes.

11. The TEM sample holder of claim 1, wherein milling the sample with the sample positioned at the first and second orientations alleviates a curtaining effect which occurs from milling the sample at one of the first and second orientations.

12. A rotatable transmission electron microscope (TEM) sample holder, the sample holder holding a sample for imaging and/or milling, the rotatable TEM sample holder comprising:

a clamp configured to releasably secure the TEM sample holder;

a clamp holder configured to releasably secure the clamp, the clamp holder having a central axis of rotation, and comprising a plurality of legs extending radially from the axis of rotation, the plurality of legs being radially offset from each other on the clamp holder; and a main stage configured to support the clamp holder and clamp, and configured to position the sample for the imaging and/or the milling;

wherein the clamp holder is configured to be rotated between a plurality of positions on the main stage by manually inserting different ones of the plurality of legs in the main stage for imaging and/or milling the sample while the sample is in one of a plurality of positions.

13. The TEM sample holder of claim 12, wherein the plurality of legs comprise two legs.

14. The TEM sample holder of claim 13, wherein the two legs define the plurality of positions as two positions each radially offset from each other by 90°.

15. The TEM sample holder of claim 14, wherein the two legs position the sample horizontally and vertically.

16. The TEM sample holder of claim 12, wherein the plurality of legs comprise three legs.

17. The TEM sample holder of claim 16, wherein the three legs define the plurality of positions as three positions each radially offset from each other by 90°.

18. The TEM sample holder of claim 17, wherein the two legs position the sample horizontally facing a first direction, vertically, and horizontally facing a second direction offset 180° from the first direction.

19. The TEM sample holder of claim 12, wherein each of the plurality of legs are circular and configured to rotate relative to the main stage about an axis perpendicular to the main stage.

20. A rotatable transmission electron microscope (TEM) sample holder, the sample holder holding a sample for imaging and/or milling, the rotatable TEM sample holder comprising:

a clamp configured to releasably secure the TEM sample holder;

a clamp holder configured to releasably secure the clamp, the clamp holder having a central axis of rotation, and comprising a plurality of legs extending radially from the axis of rotation, the plurality of legs being radially offset from each other on the clamp holder;

a main stage configured to support the clamp holder and clamp, and configured to position the sample for the imaging and/or the milling; and means for rotating the clamp holder between a plurality of positions on the main stage for imaging and/or milling the sample while the sample is in one of a plurality of positions.

* * * * *